May 16, 1967 R. LA ROSA 3,320,432

PARAMETRIC AMPLIFICATION SYSTEMS UTILIZING LOW PUMP FREQUENCIES WITH CIRCULATOR AND UP-CONVERTER ISOLATION

Filed Nov. 10, 1964 2 Sheets-Sheet 1

United States Patent Office 3,320,432

Patented May 16, 1967

3,320,432
PARAMETRIC AMPLIFICATION SYSTEMS UTILIZING LOW PUMP FREQUENCIES WITH CIRCULATOR AND UP-CONVERTER ISOLATION

Richard La Rosa, South Hempstead, N.Y., assignor to Hazeltine Research, Inc., a corporation of Illinois Filed Nov. 10, 1964, Ser. No. 410,177
3 Claims. (Cl. 307—88.3)

Figure 1:
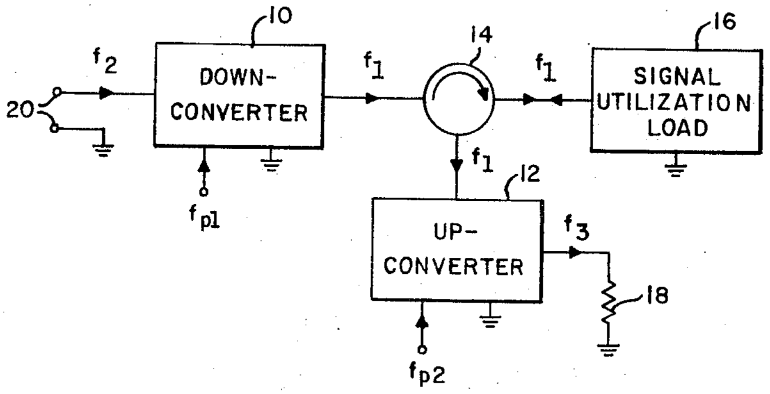

This invention relates to low noise parametric amplification systems and, more particularly, to such systems utilizing pump frequencies substantially lower than twice the input signal frequency.

Conventional parametric amplifier systems have generally required pump frequencies at least twice as great as the frequency of input signals which are to be amplified. That type of operation is acceptable for a large range of applications, however, there is a growing field of applications where it is either desirable or necessary to provide operation with pump frequencies as low as possible. For example, in the rapidly expanding area of millimeter wave applications it is difficult and uneconomical to provide pump frequencies in the high frequency portion of the millimeter range. Thus, if an input signal has a frequency of 40 gigacycles, a degenerate type of parametric amplifier would require a pump frequency twice as great as the input signal frequency, or a pump frequency of 80 gigacycles. It is difficult and costly to provide a pump power at a frequency of 80 gigacycles and it is therefore desirable to provide arrangements allowing operation with lower pump frequency.

It is known that parametric down-converters can be used to convert high frequency input signals to signals of lower frequency, so that these signals of lower frequency can then be amplified using conventional arrangements with reasonable pump frequencies. By using a regenerative down-converter both amplification and conversion to lower frequency can be accomplished in the conversion process. The principal problem involved in using either a regenerative or a nonregenerative down-converter for this purpose is that increased noise may be introduced so as to degrade the final signal-to-noise ratio, thereby making extremely low noise operation impossible.

The objects of this invention are, therefore, to provide parametric amplification systems which avoid disadvantages of prior art systems and which achieve low noise operation with pump frequencies substantially lower than twice the frequency of the input signals.

In accordance with the invention a low noise parametric amplification system for processing input signals prior to final utilization comprises a parametric down-converter means, operating with a pump frequency $f_{p1}$, for converting input signals of frequency $f_2$ to signals of a lower frequency $f_1$, where $f_{p1}=f_2+f_1$, a signal utilization load having an input port which couples back noise and nonreciprocal coupling means connected to the down-converter means for coupling the signal of frequency $f_1$ to the input port of the load and for coupling noise from the input port to a separate output port. The system also comprises a parametric upper sideband up-converter means coupled to the separate output port and operating with a pump frequency $f_{p2}$, for converting noise signals of frequency $f_1$ to signals of frequency $f_3$, where $f_3=f_{p2}+f_1$ and a dissipation means coupled to the up-converter means for resistively dissipating the signals of frequency $f_3$ without further utilization, whereby noise signals coupled back from the input port of the load are prevented from being reflected with amplification by the down-converter means and coupled to the load, the noise signals being instead up-converted to frequency $f_3$ and dissipated in the dissipation means.

For a better understanding of the present invention together with other objects thereof, reference is had to the following description taken in connection with the accompanying drawings, and its scope will be pointed out in the appended claims.

In the drawings, FIGS. 1, 2, 3, 4 and 5 show different types of low noise parametric amplification systems constructed in accordance with this invention.

Referring now to FIG. 1 there is shown a portion of a parametric amplification system of the type wherein an input signal is processed prior to coupling to a signal-utilization load. This system includes the improvement, for providing low noise operation with a pump frequency substantially lower than twice the input signal frequency, comprising the combination of the following. Parametric down-converter means, shown as regenerative down-converter 10, for converting input signals of frequency $f_2$ to signals of a lower frequency $f_1$. Parametric upper-sideband up-converter means, shown as up-converter 12, for converting signals of frequency $f_1$ to signals of a higher frequency $f_3$. Means intercoupling the down-converter 10 and the up-converter 12. These last means are shown as nonreciprocal coupling means in the form of circulator 14 and interconnecting transmission lines. As shown, circulator 14 is interconnected so that it acts to couple processed input signals from down-converter 10 to the input port of the signal utilization load 16, while at the same time any noise coupled back from the input port of load 16 is coupled to up-converter 12. In this way noise from the load 16 is prevented from being coupled to the down-converter 10, where it would be reflected with amplification and coupled back to the load 16. As shown, there is also included dissipation means, shown as resistor 18, for resistively dissipating signals up converted by up-converter 12.

Considering now the operation of the FIG. 1 arrangement, for purposes of example FIG. 1 may be considered to show a portion of a radar system wherein radar echo signals intercepted by an antenna are coupled to terminals 20 for processing prior to being coupled to signal utilization load 16 for further processing and derivation of radar information. The arrangement shown provides low noise parametric operation in such a system with a pump frequency substantially lower than twice the signal input frequency. Down converter 10 operates with a pump frequency $f_{p1}$ to convert input signals of frequency $f_2$ to signals of a lower frequency $f_1$ where the interrelation of these frequencies is such that $f_{p1}=f_2+f_1$. If desired, down-converter 10 can also amplify the input signal.

The signals of frequency $f_1$ are then coupled, via the circulator 14, to signal utilization load 16. Signal utilization load 16 may take any one of a variety of forms, such as a detector circuit, a vacuum tube amplifier, etc. As is well known, a common attribute of all such loads is an input port which acts as a noise source. If circulator 14 were removed from the circuit and down-converter 10 coupled directly to load 16, noise from the input port of load 16 would be coupled back to the down-converter 10. As is known, down-converters such as 10, act as a negative resistance with respect to signals coupled into the output port. Noise signals coupled back from the input port of load 16 would therefore be reflected with amplification by the down-converter 10. These amplified noise signals would then be coupled to load 16 and would act to degrade the signals of frequency $f_1$ which are coupled to the load 16 for final utilization. In accordance with the invention, the circulator 14 acts to couple the noise signals originating at the input port of load 16 to up-converter 12. In upper-sideband up-converter 12, these noise signals are converted to a higher frequency $f_3$ and then dissipated in resistor 18. Up-converter 12 operates with a pump frequency $f_{p2}$ and the interrelation of the frequencies involved is such that $f_3=f_{p2}+f_1$. As described in greater detail in applicant's application entitled, "Low Noise Termination," Ser. No. 33,990, filed June 6, 1960, now Patent No. 3,181,078, this process of up-conversion and termination results in only a small amount of noise being available at the input port of up-converter 12 for coupling back to the down-converter 10 (via circulator 14). Since, in accordance with the invention, only a small amount of noise is coupled back to the down-converter 10, no serious degradation of the signals of the frequency $f_1$ coupled to load 16 will result. Thus, the invention makes possible low noise amplification without the requirement for pump signals of frequencies in the range of twice the input signal frequency. The frequencies of the two pump signals required are related to the input signal by the equations given above, and the required pump signal frequencies are substantially lower than twice the input signal frequency $f_2$.

It will now be appreciated that known types of parametric up-converters and down-converters, circulators, etc., can be utilized and the present invention lies in the novel combination of such elements as described. A further simplification is possible by using a single pump source to supply pump signals for down-covnerter 10 and up-converter 12. That is to say, frequency $f_{p1}$ may be the same frequency as frequency $f_{p2}$ if desired.

Figure 2:
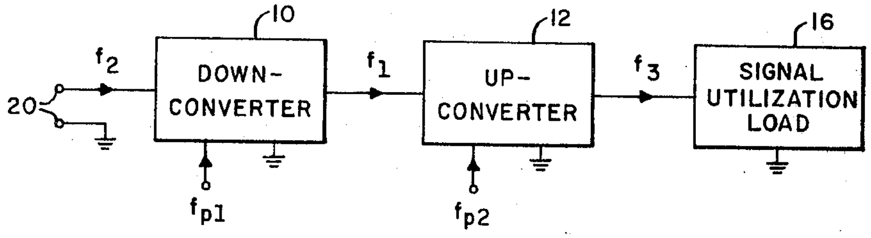

Referring now to FIG. 2, there is shown a second arrangement in accordance with the invention. In the FIG. 2, down-converter 10, up-converter 12 and signal utilization load 16 are as described with reference to FIG. 1 and the frequencies involved are related by the same equations: $f_{p1}=f_2+f_1$ and $f_3={}_{p2}+f_1$.

The FIG. 2 system preferably uses a regenertaive down-converter 10 followed by upper-sideband up-converter 12. Up-converter 12 acts as a low noise post amplifier for the down-converter 10. The up-converter 12 followed by load 16 provides low noise signal conversion and also acts as a low noise termination for the down-converter 10, so that the down-converter 10, acting as a negative resistance one-port amplifier, does not reflect much noise back to the signal utilization load 16. The complete system of FIG. 2 provides low noise amplification and is useful with pump frequencies close to the input signal frequency.

Figure 3:
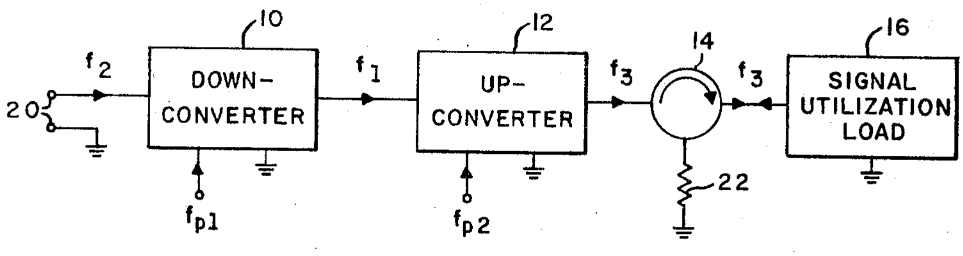

Referring now to FIG. 3 there is shown another arrangement in accordance with the invention. The FIG. 3 system is similar to the FIG. 2 system except that a circulator 14 has been inserted between up-converter 12 and load 16. In operation of the FIG. 3 system, noise coupled back from the input port of load 16 is coupled to resistor 22, via circulator 14, where it is dissipated. The addition of the circulator 14 provides the important advantage of isolation so that any variations in the characteristics of load 16 are prevented from affecting the operation of both up-converter 12 and, especially, down-converter 10.

Figure 4:
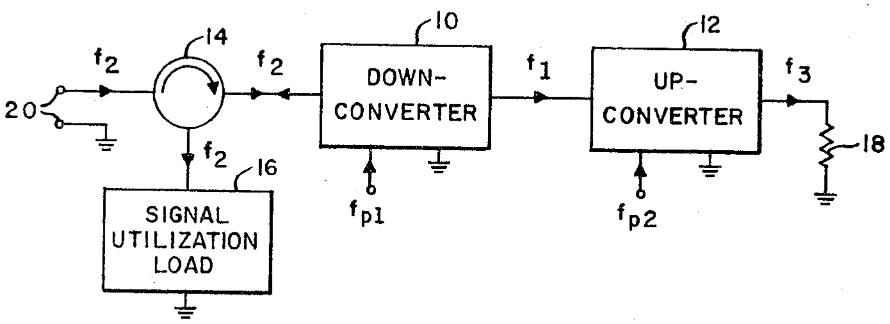

Referring now to FIG. 4, there is shown a fourth system constructed in accordance with the invention. In FIG. 4 the individual elements bear reference numerals corresponding to similar elements in preceding figures.

The FIG. 4 system makes use of the fact that in the arrangements of FIGS. 1, 2 and 3 there will be a considerable amount of reflected energy available at the input to down-converter 10. This is because the down-converter 10 presents a negative resistance at its input and this negative resistance causes input signals of frequency $f_2$ to be reflected with amplification. Circulator 14 acts to couple these reflected input signals to signal utilization load 16. The remainder of the FIG. 4 system operates similarly to the FIG. 2 system except that the signals of frequency $f_3$ produced by up-converter 12 are dissipated in resistor 18 instead of being utilized in load 16. The FIG. 4 system can be considered to comprise a negative resistance amplifier 10 followed by a low noise termination. Up-converter 12 and resistor 18 form a low noise termination as discussed in detail in applicant's above-mentioned application.

Of special interest is the result obtained by pumping both the down-converter 10 and the up-converter 12 of FIG. 4 from a single pump source. Such an arrangement results in an amplifier which has improved stability under conditions of varying pump signal power. If the diodes of converters 10 and 12 are pumped approximately equally hard, they will both have the same variation in the first harmonic elastance factor and as a result, the reflection coefficient presented to the circulator will be stabilized to some extent. Also, if the pump frequencies of the down-converter 10 and the up-converter 12 are chosen to be equal, the same diode can be used by both the down-converter 10 and the up-converter 12. However, the same diode can only be used in the embodiments shown by FIGS. 2, 3 and 4 where there are no elements between the down-converter 10 and the up-converter 12.

Figure 5:
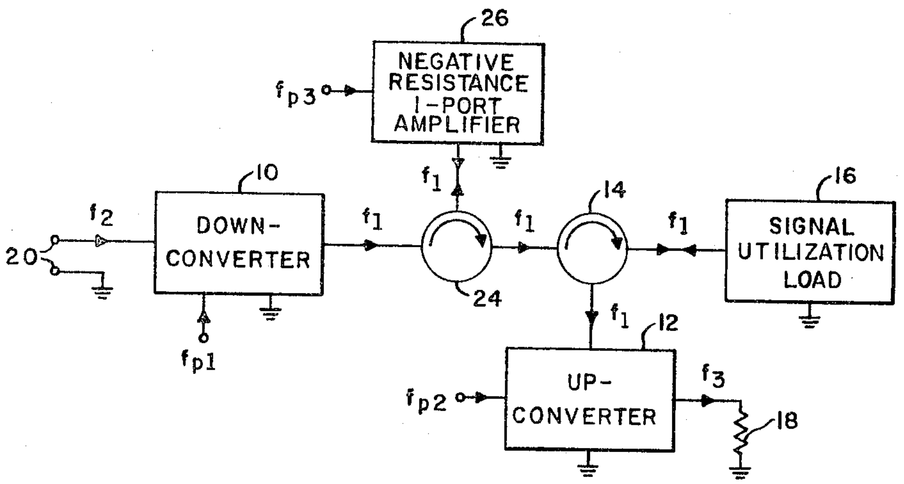

Referring now to FIG. 5, there is shown an additional system in accordance with the invention. The FIG. 5 arrangement is similar to the FIG. 1 arrangement except that an additional circulator 24 and negative resistance one-port amplifier 26 have been added. Operation of the FIG. 5 system is similar to that of FIG. 1 except that additional amplification is provided by coupling the signals of frequency $f_1$ to the amplifier 26, via circulator 24, for amplification prior to coupling the signals to circulator 14. The FIG. 5 arrangement allows amplifier 26 to operate with lower frequencies as compared to amplification of the input signals of frequency $f_2$ directly. It will, of course, be easier to construct amplifier 26 to amplify the lower frequency $f_1$ signals.

Approximate noise figures for certain of the above-discussed arrangements will now be derived. The assumption will be made that the principal loss involved is in the termination of the $f_3$ signals and other losses will be ignored. Assume that down-converter 10 presents a reflection coefficient magnitude of $|\rho|^2$ at its $f_1$ output. All powers will be normalized to the available power of the $f_2$ signal source (the incident power) in this discussion.

The $f_2$ power entering the down-converter 10 is $$(1-|\rho|^2)\cdot|\rho|^2$$

will be assumed to be greater than 1. Therefore, the power flow is outward at frequency $f_2$. The Manley-Rowe relations lead to the result that the power leaving down-converter 10 at frequency $f_1$ is $$\frac{f_1}{f_2}(|\rho|^2-1)$$

The Manley-Rowe relations require that power flow into up-converter 12 at one port and flow out at the other port. Thus, the power dissipated in the $f_3$ termination is:

$$\frac{f_3}{f_1}\cdot\frac{f_1}{f_2}(|\rho|^2-1)=\frac{f_3}{f_2}(|\rho|^2-1) \qquad (1)$$

Equation (1) gives the gain of the FIG. 2 system and also the FIG. 3 system. For FIG. 4 the gain is $|\rho|^2$ and for FIG. 1 the gain is $$\frac{f_1}{f_2}(|\rho|^2-1)$$

System noise comes almost solely from the termination of the $f_3$ signals. In FIG. 2, the $f_3$ signal termination is the signal utilization load 16 which would be likely to be a mixer. The correlation between load output noise and noise available from the load input port is not known, however the analysis can be made more definite by considering the FIG. 3 circuit rather than the FIG. 2 circuit.

The $f_3$ signal termination is assumed to be at temperature $T_0$, which is the temperature of the source of the $f_2$ frequency input signals. Actually, the $f_3$ signal termination would be at ambient temperature, but the simplest case is taken for purposes of explanation. In a lossless converter the reflection coefficient magnitude is the same at either end. Likewise, the reflection coefficient magnitude at either end of the two cascaded converters 10 and 12 is the same in the ideal case. (The converters 10 and 12 are cascaded in FIGS. 2, 3 and 4, but not in FIG. 1.)

Considering the circuit of FIG. 3, the noise $kT_0B$ from the $f_3$ termination 22 is reflected from the output terminal of the up-converter 12 and $|\rho|^2\ kT_0B$ reaches the load 16. The noise figure of this converter system is:

$$F=1+\frac{|\rho|^2}{\frac{f_3}{f_2}(|\rho|^2-1)} \quad (2)$$

The general equation for noise measure is:

$$M=\frac{F-1}{1-\frac{1}{G}}$$

where G is the gain. Therefore the noise measure of this system is:

$$M=\frac{|\rho|^2}{\frac{f_3}{f_2}(|\rho|^2-1)\left(1-\frac{1}{\frac{f_3}{f_2}(|\rho|^2-1)}\right)}=\frac{|\rho|^2}{\frac{f_3}{f_2}(|\rho|^2-1)-1} \quad (3)$$

In the FIG. 4 system, noise $kT_0B$ generated in load 18 is incident on the $f_3$ port of the two cascaded converters 10 and 12 and $(1-|\rho|^2)\ kT_0B$ is accepted by the converters. The Manley-Rowe relations require that $$\frac{f_2}{f_3}(|\rho|^2-1)kT_0B$$

emerges from the $f_2$ port of the cascaded converters so that the FIG. 4 noise figure is:

$$F=1+\frac{\frac{f_2}{f_3}(|\rho|^2-1)}{|\rho|^2}=1+\frac{f_2}{f_3}\left(1-\frac{1}{|\rho|^2}\right) \quad (4)$$

The noise measure is:

$$M=\frac{F-1}{1-\frac{1}{|\rho|^2}}=\frac{f_2}{f_3} \quad (5)$$

For the FIG. 1 system, the noise factor is:

$$F=1+\frac{|\rho|^2\frac{f_1}{f_3}}{\frac{f_1}{f_2}(|\rho|^2-1)} \quad (6)$$

Therefore the noise measure is:

$$M=\frac{\frac{f_1}{f_3}|\rho|^2}{\frac{f_1}{f_2}(|\rho|^2-1)\left(1-\frac{1}{\frac{f_1}{f_2}(|\rho|^2-1)}\right)} \quad (7)$$

$$M=\frac{|\rho|^2}{\frac{f_3}{f_2}(|\rho|^2-1)-\frac{f_3}{f_1}} \quad (8)$$

For very high frequencies (i.e., $f_2$ equals 3 k. mc. or higher) the FIG. 1 system requires good signal utilization load 16 noise figures unless large regeneration in down-converter 10 is provided. In a practical system it is preferable to operate with small regeneration (small $|\rho|$) so that circuit adjustment is not critical. With the arrangements of FIGS. 1 and 3, the converter noise figure (the values of F as calculated here) goes to infinity as $|\rho|$ approaches unity. With the FIG. 4 system the parametric device is in essence a one-port amplifier in combination with a circulator and F approaches zero as $|\rho|$ approaches unity. In FIG. 2, the correlation between directly transmitted and reflected load noise might allow some improvement by choosing proper line lengths between the load and the up-converter 12.

For situations where both pump frequencies ($f_{p1}$ and $f_{p2}$) are limited to a maximum value (say $f_p$), the noise figure of the system of FIG. 4 can be minimized by using the maxmium allowed pump frequency for pumping both converters 10 and 12. In this case the noise figure is:

$$F=1+\frac{f_2}{2f_p-f_2}\left(1-\frac{1}{|\rho|^2}\right) \quad (9)$$

The FIG. 4 circuit is a one-port parametric amplifier with a low noise idler termination formed by the up-converter 12. If the up-converter 12 were absent and the converter 10 were operating with an idler termination in the form of a resistor at temperature $T_o$, the noise figure would be:

$$F=1+\frac{f_2}{f_p-f_2}\left(1-\frac{1}{|\rho|^2}\right) \quad (10)$$

Thus, the FIG. 4 arrangement is equivalent to a one-port amplifier using twice the pump frequency (i.e., the noise figure in (10) is larger than the noise figure in (9) for the same pump frequency. A similar noise figure would result only if the pump frequency in (10) were twice the pump frequency in (9)).

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. A low noise parametric amplification system, for processing input signals prior to final utilization, comprising:

parametric down-converter means, operating with a pump frequency $f_{p1}$, for converting input signals of frequency $f_2$ to signals of a lower frequency $f_1$, where $f_{p1}=f_2+f_1$;

a signal utilization load having an input port which couples back noise;

nonreciprocal coupling means connected to said down-converter means for coupling said signal of frequency $f_1$ to said input port of said load and for coupling noise from said input port to a separate output port;

parametric upper-sideband up-converter means coupled to said separate output port and operating with a pump frequency $f_{p2}$ for converting noise signals of frequency $f_1$ to signals of frequency $f_3$, where $f_3=f_{p2}+f_1$;

and dissipation means coupled to said up-converter means for resistively dissipating said signals of frequency $f_3$ without further utilization;

whereby noise signals coupled back from said input port of said load are prevented from being reflected with amplification by said down-converter means and coupled to said load, said noise signals being instead up-converted to frequency $f_3$ and dissipated in said dissipation means.

2. A system in accordance with claim 1, wherein the parametric down-converter means provides regenerative amplification.

3. A low noise parametric amplification system, for processing input signals prior to final utilization, comprising:

parametric down-converter means, operating with a pump frequency $f_{p1}$, for converting input signals of frequency $f_2$ to signals of a lower frequency $f_1$, where $f_{p1}=f_2+f_1$;

parametric negative resistance one-port amplifier means for amplifying said signals of frequency $f_1$;

a signal utilization load having an input port which couples back noise;

nonreciprocal coupling means connected to said down-converter means for coupling said signals of frequency $f_1$ to said one-port amplifier means, coupling amplified signals of frequency $f_1$ from said one-port amplifier means to a first separate output port, coupling said signals of frequency $f_1$ to said input port of said load and coupling noise from said input port to a second separate output port;

parametric upper-sideband up-converter means coupled to said second separate output port and operating with a pump frequency $f_{p2}$, for converting noise signals of frequency $f_1$ to signals of frequency $f_3$, where $f_3=f_{p2}+f_1$;

and dissipation means coupled to said up-converter means for resistively dissipating said signals of frequency $f_3$ without further utilization;

whereby noise signals coupled back from said input port of said load are prevented from being reflected with amplification by said down-converter means coupled to said load, said noise signals being instead up-converted to frequency $f_3$ and dissipated in said dissipation means.

References Cited by the Examiner

UNITED STATES PATENTS 3,181,078 4/1965 La Rosa ------------ 330—4.6

OTHER REFERENCES

Hogan et al.: "Journal of Applied Physics," March 1958, pp. 422–423.

Reed: "IRE Transactions On Electronic Devices," April 1959, p. 218 relied on.

ROY LAKE, *Primary Examiner.*

D. R. HOSTETTER, *Assistant Examiner.*